(12) United States Patent
Feng et al.

(10) Patent No.: US 7,249,213 B2
(45) Date of Patent: Jul. 24, 2007

(54) MEMORY DEVICE OPERABLE WITH A PLURALITY OF PROTOCOLS WITH CONFIGURATION DATA STORED IN NON-VOLATILE STORAGE ELEMENTS

(75) Inventors: Eugene Feng, San Jose, CA (US); Douglas Lee, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 148 days.

(21) Appl. No.: 10/643,249

(22) Filed: Aug. 18, 2003

(65) Prior Publication Data
US 2005/0060469 A1  Mar. 17, 2005

(51) Int. Cl.
G06F 13/40 (2006.01)
G06F 13/42 (2006.01)
G06F 13/14 (2006.01)
(52) U.S. Cl. .................... 710/305; 710/105
(58) Field of Classification Search ............. 710/104, 710/105, 51; 360/63, 230.06, 189.07
See application file for complete search history.

(56) References Cited
U.S. PATENT DOCUMENTS

| | | | | |
|---|---|---|---|---|
| 4,032,949 A | * | 6/1977 | Bierig | 257/529 |
| 4,783,606 A | * | 11/1988 | Goetting | 326/44 |
| 5,039,885 A | * | 8/1991 | Goetting et al. | 326/40 |
| 5,151,611 A | * | 9/1992 | Rippey | 327/525 |
| 5,444,650 A | * | 8/1995 | Abe et al. | 365/96 |
| 5,596,538 A | * | 1/1997 | Joo | 365/201 |
| 5,991,841 A | | 11/1999 | Gafken et al. | |
| 6,330,635 B1 | * | 12/2001 | Stafford | 711/103 |
| 6,421,765 B1 | | 7/2002 | Poisner | |
| 6,718,407 B2 | * | 4/2004 | Martwick | 710/51 |
| 6,851,014 B2 | * | 2/2005 | Chang et al. | 711/103 |
| 6,871,244 B1 | * | 3/2005 | Cahill et al. | 710/62 |
| 7,032,045 B2 | * | 4/2006 | Kostadinov | 710/105 |

OTHER PUBLICATIONS

Programmable Microelectronics Corporation; "PMC Two-in-One Firmware Hub/Low Pin Count Flash Memory Achieves Mass Production with Leading Personal Computer and Notebook Manufacturers"; Programmable Microelectronics Corporation; Oct. 28, 2002; available online at www.chingistek.com; all pages.*

* cited by examiner

Primary Examiner—Paul R. Myers
Assistant Examiner—Ryan Stiglic
(74) Attorney, Agent, or Firm—DLA Piper US LLP

(57) ABSTRACT

An improved memory device is operable in a plurality of protocols. The improved memory device has an interface circuit which receives communication signals from a communication bus. The interface circuit decodes the communication signals and generates a plurality of protocol signals and outputs one of the plurality of protocol signals in response to a select signal. A user selectable nonvolatile memory or fuse stores user selected protocol and generates the select signal corresponding to the user selected protocol. The memory device further comprises a nonvolatile memory and a controller for controlling the nonvolatile memory. The controller is responsive to the one protocol signal that is selected.

10 Claims, 5 Drawing Sheets

MEMORY DEVICE OPERABLE WITH A PLURALITY OF PROTOCOLS WITH CONFIGURATION DATA STORED IN NON-VOLATILE STORAGE ELEMENTS

TECHNICAL FIELD

The present invention relates to a memory device which can interface and operate with a plurality of protocols and in particular to a non-volatile memory device which can be used with a plurality of different protocols such as LPC and FWH protocols, based upon configurations stored in non-volatile fuses.

BACKGROUND OF THE INVENTION

Computer systems are well known in the art. In particular, a computer system adhering to the "IBM PC" standard is well known in the art. Referring to FIG. 1, there is shown a computer system 10 of the prior art. The computer system 10 conforms to the "IBM PC" architecture. The system 10 comprises typically a motherboard 12 on which are mounted a variety of components such as a processor 14, such as a Pentium microprocessor made by Intel Corporation, a memory controller hub (MCH) chip 16, and a IO controller hub (ICH) chip 18. The MCH 16 and the ICH 18 are known as chipsets and can be obtained from Intel Corporation. Finally, the motherboard 12 comprises a BIOS 20 which is typically a non-volatile memory device. The foregoing system is described and is disclosed in U.S. Pat. No. 6,421,765. See also U.S. Pat. No. 6,330,635.

Intel Corporation, a developer of the MCH chip 16, also developed the ICH chip 18 which has a particular feature known as a low pin count (LPC) bus. See, for example, U.S. Pat. No. 5,991,841. The LPC bus communicates between the ICH chip 18 and the BIOS 20. At the time that Intel Corporation introduced the LPC bus 30, it disclosed that the LPC bus 30 is operable in accordance with the standard as disclosed in FIG. 2. This is also disclosed in U.S. Pat. No. 5,911,841. The LPC bus 30 comprises four signal lines between the ICH chip 18 and the peripheral devices such as the BIOS memory device 20. Along the four signal lines, designated as LAD [3:0], are supplied command, data and address signals. As shown in FIG. 2, the initial field for the LAD bus is a start field. This is then followed by the address and the data signals.

Initially, when Intel Corporation opened or disclosed the format of the LPC bus 30, it disclosed to the public that the ICH chip 18 is operable with a memory device 20 only in accordance with the FWH protocol. Thus, Intel disclosed that when the LAD [3:0] signals had the bit pattern of "1101" or "1110" in the start field, then that represents communication with a BIOS memory device 20.

At the time that Intel announced the FWH protocol for the ICH chip 18, other semiconductor chip makers also made and sold chipsets, such as the combination of MCH chip 16 and ICH chip 18 that communicate in the LPC protocol. However, these chipset makers established a protocol in which the start field having the bit pattern of "0000" would mean the start of a cycle for the BIOS memory device 20. Thus, to a manufacturer and supplier of a BIOS memory device 20, the manufacturer must maintain two sets of inventory: one set of memory device 20 that is operable under the FWH protocol for Intel and another set of memory devices 20 that are operable with the LPC protocol from other chipset makers. It should be noted that the difference in operation between the LPC protocol and the FWH protocol is well known in the art. For example, the address field and select field are handled slightly differently in the LPC and FWH as well as the decoding of these. In the FWH protocol, there are four (4) bits of the IDSEL field and 28 bit address field. In the LPC protocol there are 32 bit address field with IDSEL included.

On Aug. 20, 2002, Intel announced that its ICH chip 18 would be able to operate with a BIOS memory device 20 with either the FWH protocol or the LPC protocol. For the manufacturer of the BIOS memory device 20, having a memory device which is operable in two protocols would eliminate the inventory problem.

Hence, this is one of the objectives of the present invention.

SUMMARY OF THE INVENTION

In the present invention, a memory device communicates with an integrated circuit via a communication bus. The memory device comprises an interface circuit which receives the communication signals from the communication bus, and decodes the communication signals, and generates a plurality of protocol signals, and outputs one of the plurality of protocol signals in response to a select signal. The memory device also comprises a user-selectable non-volatile memory for storing user selected protocol and generates the select signal, corresponding to the user selected protocol. The memory device further comprises a non-volatile memory, and a controller for controlling the non-volatile memory. The controller is responsive to the one protocol signal.

DETAILED DESCRIPTION OF THE INVENTION

Figure 1:
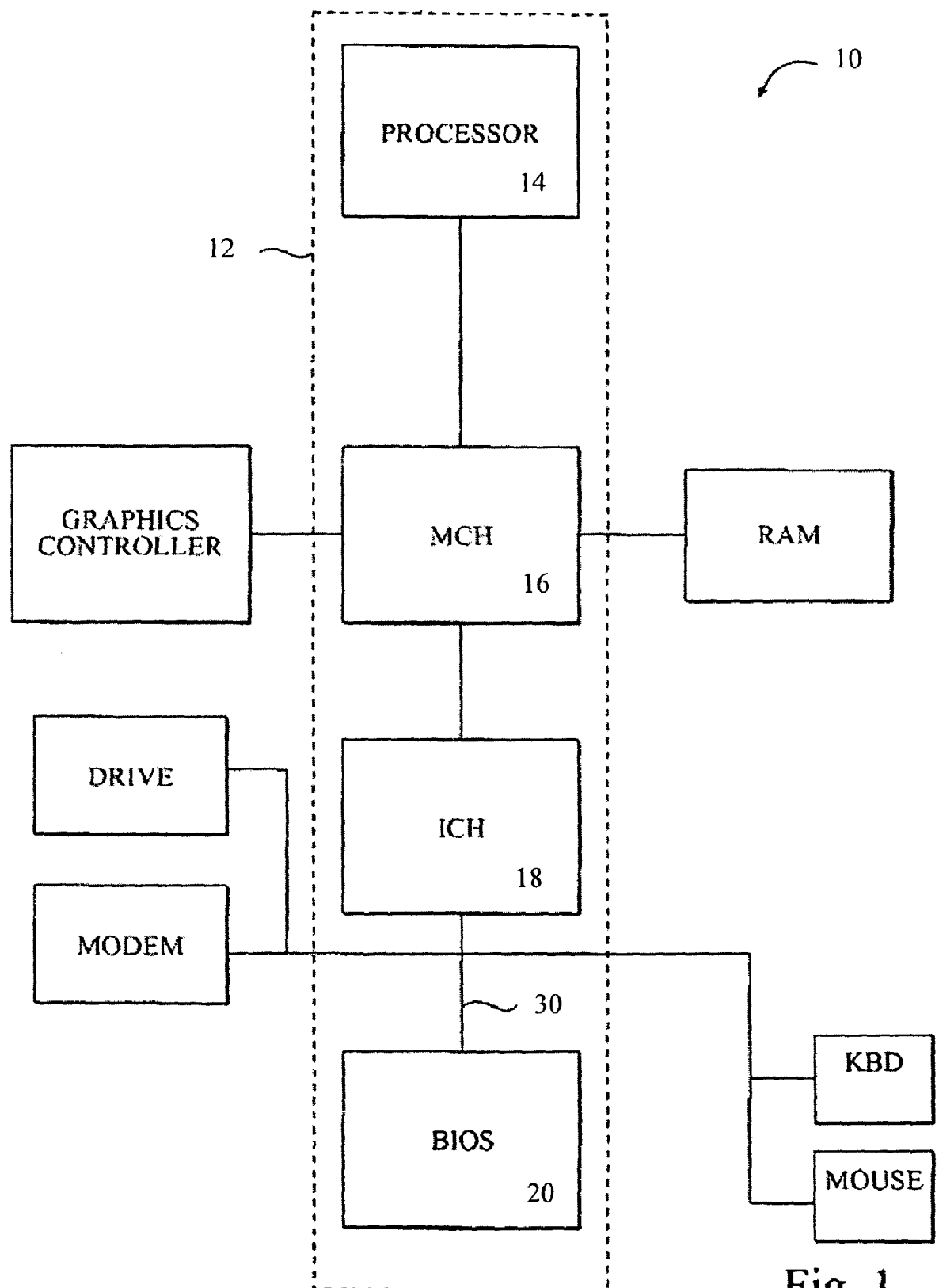
FIG. 1 is a block diagram view of a computer system in accordance with the "IBM PC" architecture of the prior art.
Figure 2:
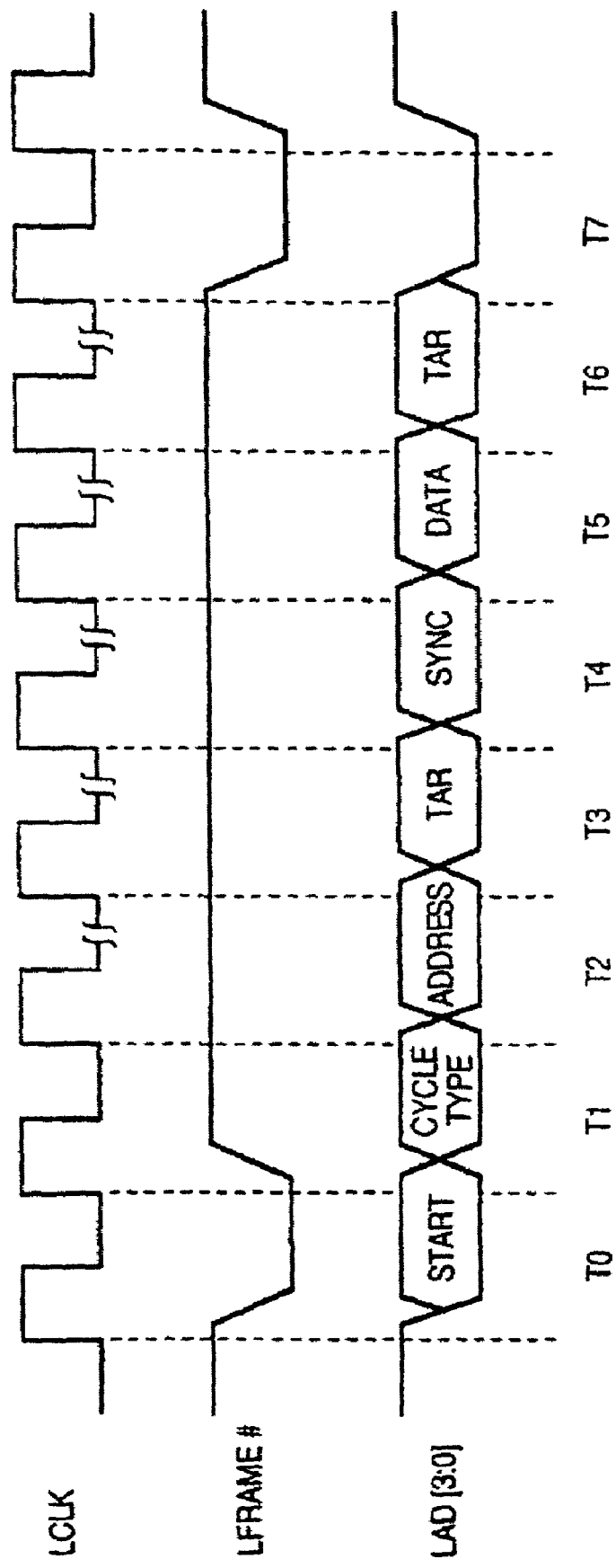
FIG. 2 is a timing diagram showing the protocol of communication between the ICH chip 18 and the BIOS memory device 20 in accordance with the computer system shown in FIG. 1.
Figure 3:
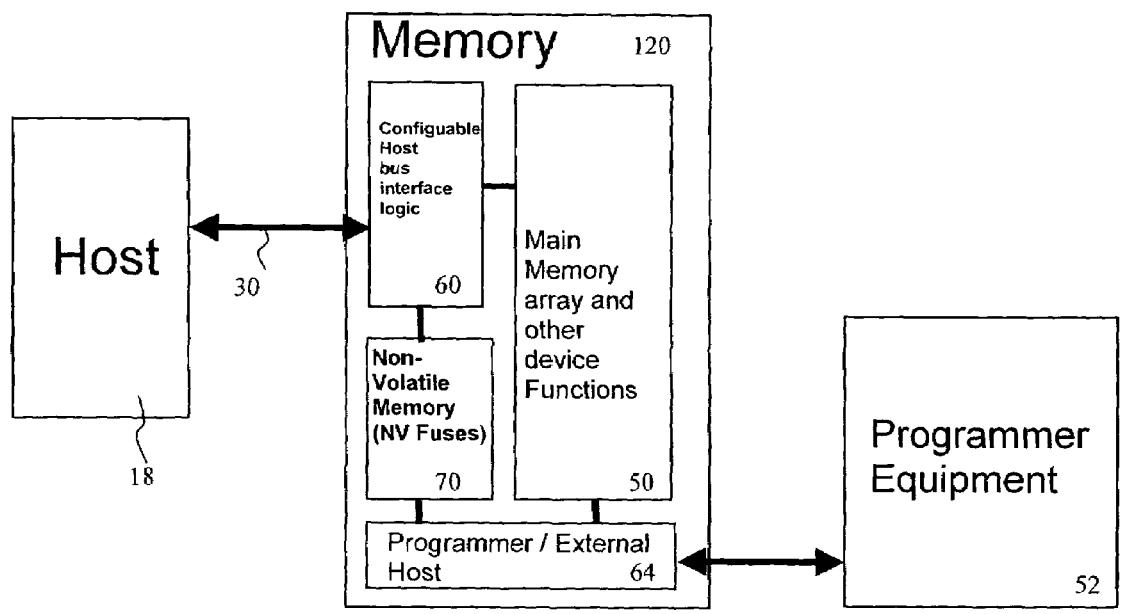
FIG. 3 is a block diagram of the configurable protocol memory device of the present invention, which can be operated with the ICH chip 18 over an LPC bus 30.

Referring to FIG. 3, there is shown an improved memory device 120 of the present invention. The improved memory device 120 is capable of operating via an LPC bus 30 with either a chipset 18 that is communicating in the LPC protocol or the FWH protocol. Further, with the present invention, the memory device 120 is operable with a plurality of different protocols. The improved memory device 120 in the first embodiment is similar to the BIOS memory device 20 of the prior art and has a main memory array and other device functions 50 which typically consists of an array of nonvolatile memory cells. The improvement of the memory device 120 of the present invention is in the interfacing logic circuit 60 which interfaces with the LPC bus 30 and in particular the LAD [3:0] signals of the LAD bus or the communication bus 30. In addition, the memory device 120 has a nonvolatile memory 70, such as a nonvolatile memory fuse. The fuse 70 once programmed is used to control the configurable interface logic circuit 60. The improved memory device 120 also comprises a programmer external host circuit 64 which interfaces with the nonvolatile memory fuse 70. In addition, the programmer external host circuit 64 can be used to program the main memory array and other device function circuit 50. Finally, external to the improved memory device 120 is a programmer equipment 52, which is used to program the programmer external host 64.

Figure 4:
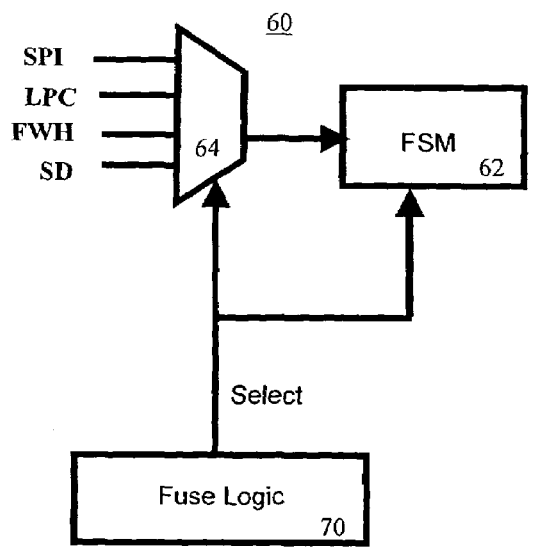
FIG. 4 is a block level diagram of one embodiment of the configurable bus interfacing logic circuit portion and the non-volatile memory used to configure the bus interface logic circuit of the protocol memory device of the present invention.

Referring to FIG. 4, there is shown a detailed block level diagram of the configurable host bus interface logic circuit 60. In the first embodiment of the present invention, the interface logic circuit 60 comprises a multiplexer 64 which receives communication in a plurality of different protocols such as SPI, SD, FWH or LPC communication bus 30. Each of the protocols: SPI, SD, FWH or LPC is a protocol different from one another. From the multiplexer 64, one protocol is selected and is outputted from the multiplexer 64 and is applied to a finite state machine 62. The finite state machine 62 is a well known controller for controlling, for example, the operation of the nonvolatile memory cells of the main memory array 50. The nonvolatile memory fuse 70 is a fuse logic circuit 70 which has an output which controls the multiplexer circuit 64 and the finites state machine 62.

In the operation of the embodiment shown in FIGS. 3 and 4, a user programs the memory device 120 through the programmer equipment 52 to set the fuses in the fuse logic circuit 70 such that the improved memory device 120 is operable with one of the plurality of protocols supplied thereto. The fuse logic circuit 70 once programmed will control the multiplexer 64 and the finite state machine 62.

Figure 5:
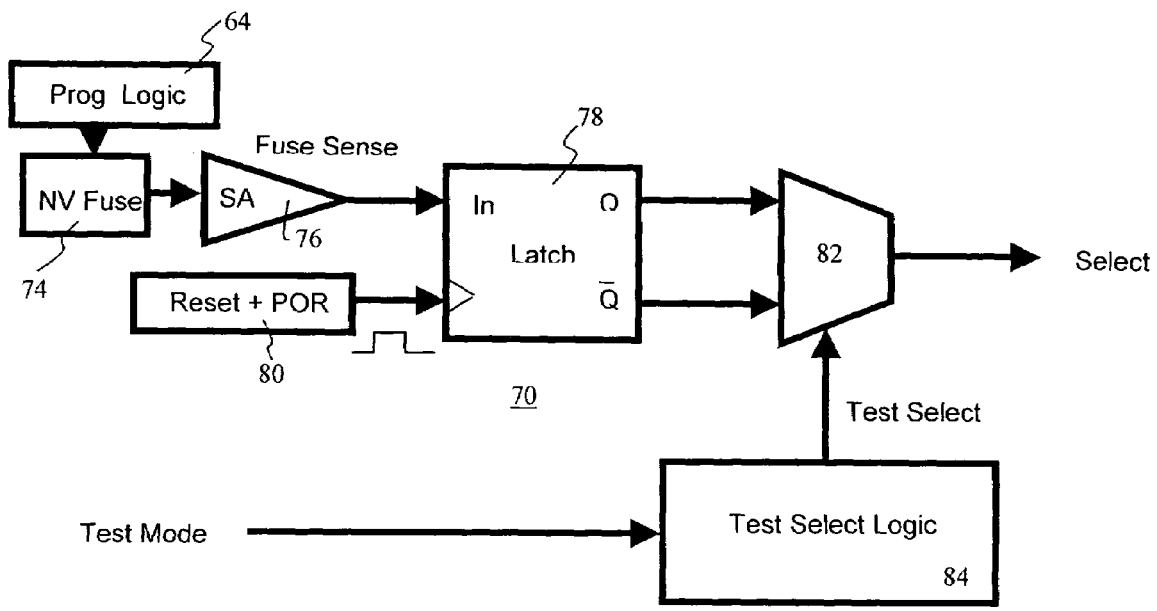
FIG. 5 is a detailed schematic diagram of the fuse logic circuit portion shown in FIG. 4.

Referring to FIG. 5, there is shown a detailed circuit diagram of the fuse logic circuit 70. The fuse logic circuit 70 comprises a plurality of nonvolatile fuses 74 which are programmed by the programming logic circuit 64. The fuses 74 are supplied to a fuse sense amplifier 76 which detects the states of the fuses in the plurality of nonvolatile memory fuses 74. The output of the fuse sense amplifier 76 is applied to one or more latches 78. A reset+POR (reset or Power-On-Reset) circuit 80 supplies a signal to the input of the latch 78 and resets the latch 78 during a power-on cycle or an asserted reset cycle. The Q and Q bar outputs of the latch 78 are supplied to a second multiplexer 82 whose output is the select signal which is supplied to the multiplexer 64 and the finite state machine 62. The fuse logic circuit 70 also comprises a test select logic circuit 84.

In the operation of the fuse logic circuit 70, the user, through the programmer equipment 52, and through the programmer external host circuit 64, programs the nonvolatile fuses 74. This can be done at any time prior to the memory device 120 is "installed", e.g., mounted on a printed circuit board, or it can be done after the memory device 120 has been installed on a printed circuit board and is programmed "in-situ". Thereafter, and in the operation of the memory device 120, as the memory device 120 receives signals from the communication bus 30, the state of the nonvolatile fuses 74 is sensed by a sense amplifier 76. The state of the nonvolatile fuses 74 is then used to set or reset one or more of the latches 78. If the device 120 is not in a test mode, then the multiplexer 82 would receive the Q output of the latch 78 and output that as the select signal supplied to the multiplexer 64 and the finite state machine 62. If the memory device 120 were in a test mode, then the test mode signal would be supplied to the test select logic circuit 84 which would set the first multiplexer 82, which would take the Q bar output of the latches 78 and supply that as a select signal to the multiplexer 64 and the finite state machine 62. The reset+POR circuit 80 gates the value stored in the NV fuse during a power-on cycle or an asserted reset cycle.

Figure 6:
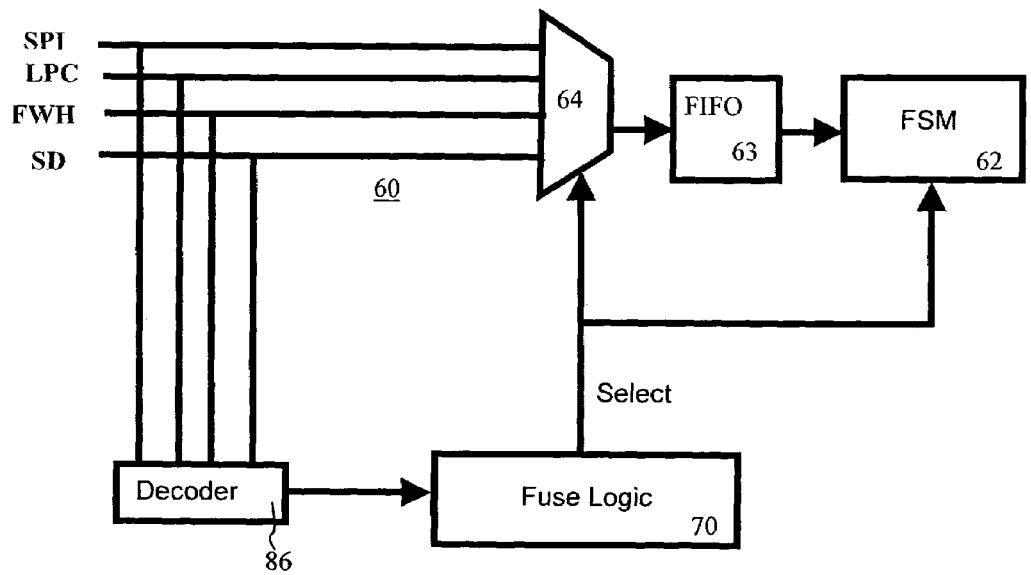
FIG. 6 is a block level diagram of another embodiment of the configurable bus interfacing logic circuit portion and the non-volatile memory used to configure the bus interface logic circuit of the protocol memory device of the present invention.

Referring to FIG. 6, there is shown another embodiment of the improved memory device 120 of the present invention. In this embodiment, the configurable host bus interface logic circuit 60 receives a plurality of protocol signals from various buses such as the SPI, SD, FWH or LPC. These signals are all supplied to a multiplexer 64. Similar to the embodiment shown in FIG. 4, the multiplexer 64 is switched by the select signal supplied from the fuse logic circuit 70. The output of the multiplexer 64 is supplied to a FIFO memory 63 which acts as a delay. From the FIFO memory 63, the selected protocol signals are supplied to a finite state machine 62, which also receives the select signal from the fuse logic circuit 70. The FIFO memory 63 serves to delay the protocol signals so that the fuses 74 can be programmed before the signals are supplied to the controller 62. The difference between the embodiment shown in FIG. 6 and the embodiment shown in FIG. 4 is the manner in which the nonvolatile fuses 74 are set or programmed. In the embodiment shown in FIG. 6, the signals from the buses SPI, FWH, LPC, and the SD buses are all supplied to a decoder 86. The decoder 86 senses "on the fly" the signals that are received on the various buses and selects or programs the nonvolatile fuses 74 within the fuse logic 70 as the protocol signals are received. Thus, in the embodiment shown in FIG. 6, the fuses 74 are programmed "on the fly" and in situ. Once programmed, the fuse logic circuit 70 then operates the multiplexer 64 in the same manner as that shown as described in the embodiment shown in FIG. 5.

In the operation of the fuse logic circuit 70, the user may be able to program the non-volatile fuses 74 utilizing a "Test Mode" sequence similar to that described for the "on the fly" configuration but manually administered with other than using programming equipment as previously described. In this way, configuration may occur when the device is installed in the system or on the system board by utilizing a Test mode to select the protocol configuration desired.

Figure 7:
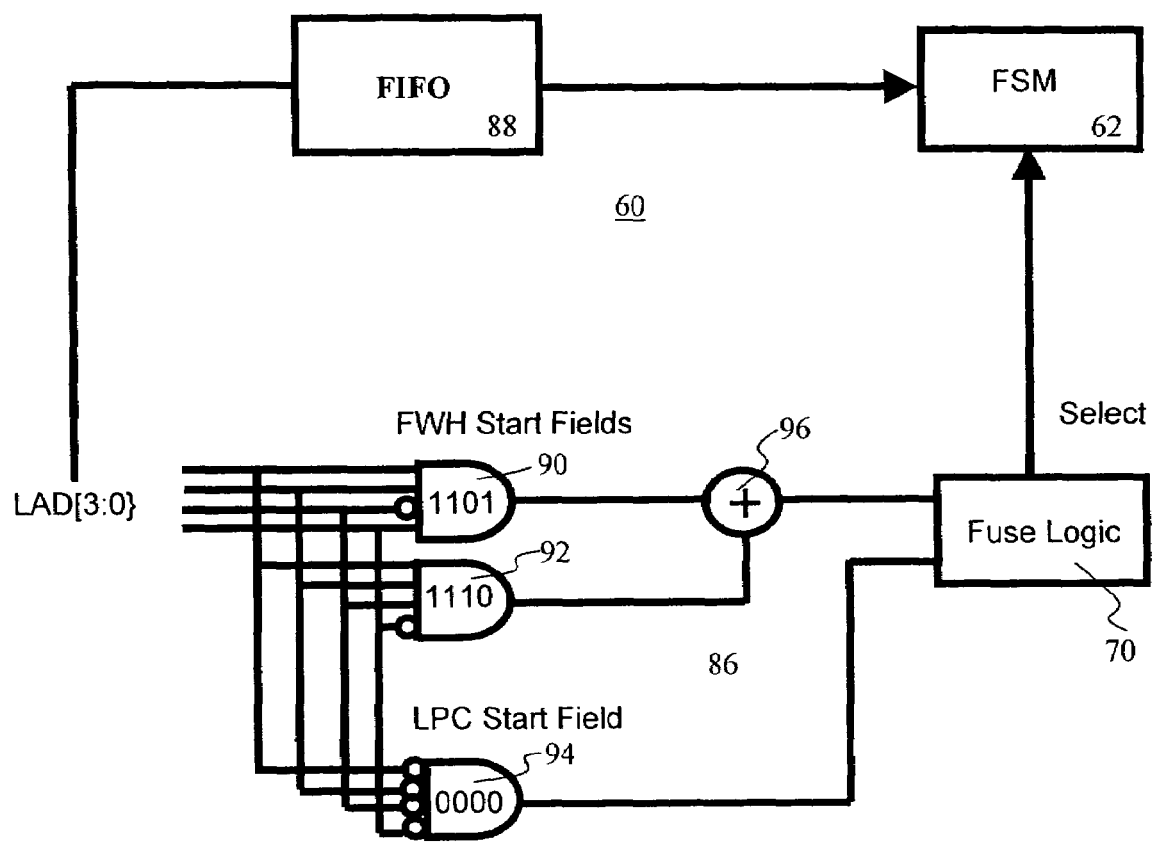
FIG. 7 is a detailed circuit diagram of yet another embodiment of the configurable bus interfacing logic circuit portion and the non-volatile memory used to configure the bus interface logic circuit of the protocol memory device of the present invention.

Referring to FIG. 7, there is shown yet another embodiment of the improved memory device 60 of the present invention. In this embodiment, shown in FIG. 7, the improved memory device 120 is specifically designed for use with the LPC bus 30 and its attending protocols of LPC and FWH. Thus, the LAD [3:0] bus 30 comprises four signal lines which are supplied to a first logic circuit 90, a second logic circuit 92, and a third logic circuit 94. The difference between the first, second, and third logic circuits 90, 92 and 94, respectively, is the manner in which the logic circuit decodes the signals from the LAD communication bus. The first decode logic circuit 90 is an AND logic circuit that receives the signal "xxyx" where x is a signal from the LAD communication bus 30 and y is the inverse of the signal from the LAD communication bus 30. Thus, in the event the start field has a bit pattern of "1101", the output of the first logic decoding circuit 90 is a "1". Similarly, the second logic decoding circuit is an AND logic circuit that receives the bit pattern of "xxxy" where x is the signal from the LAD communication bus 30 and y is the inverse of the signal from the LAD communication bus 30. Thus, if the bit pattern from the start field is "1110", then the output of the second logic decoding circuit 92 is a bit pattern of "1". The first logic decoding circuit 90, and the second logic decoding circuit 92 are supplied to an OR gate 96 which produces a signal which is supplied to the fuse logic circuit 70. The output of the OR circuit 96 is high or "1" if the start field is either the bit pattern of "1101" or "1110", either of which signifies that the LAD communication bus is operating the FWH protocol.

The LAD communication bus 30 is also supplied to the third logic decoding circuit 94. The third logic decoding circuit 94 is also an AND logic circuit that receives the signals "yyyy" in which y is the inverse of the signal from the LAD communication bus 30. Thus, if the start field in the LAD communication bus is "0000", the output of the third logic decoding circuit 94 is a "1". This signifies that the communication bus 30 is operating in the "LPC" protocol mode. The output of the third logic decoding circuit 94 is supplied also to the fuse logic circuit 70. Thus, either the signal from the output of the OR circuit 96 or the output of the third logic circuit 94 is supplied to the fuse logic circuit 70 which programs the fuses 74. Based upon the state programmed into the fuses 74, the latches 78 are appropriately set and an appropriate select signal is supplied to the finite state machine 62. The LAD communication buses also supply to a FIFO memory 88 which delays the signal from the communication bus 30 until the fuses have been set in the fuse logic circuit 70. The signals from the FIFO 88 are then supplied to the SM 62 which would be operating in accordance with the state programmed in the fuses 74.

From the foregoing, it can be seen that with the improved memory device 120 of the present invention, a single memory device can be used with a plurality of protocols. The invention allows the memory device 120 to choose which protocol, e.g. LPC, FWH, SPI, or SD, to respond depending upon the settings in the non-volatile fuses 74 Thus, the manufacturer of the memory device would then need to maintain only one inventory of the products.

What is claimed is:

1. A memory device for communicating with an integrated circuit via a communication bus, said device comprising:
    an interface circuit for receiving communication signals from the communication bus, and for decoding the communication signals, and for generating a protocol select signal;
    a multiplexer for receiving the plurality of protocol signals and for outputting one of the plurality of protocol signals corresponding to a one protocol in response to a select signal;
    a user selectable non-volatile memory for storing user input representative of the one protocol and is responsive to the protocol select signal for generating the select signal;
    a non-volatile memory; and
    a controller for controlling the non-volatile memory; said controller responsive to said select signal;
    wherein upon storing the user input, the memory device is responsive to communication signals only in the one protocol.

2. The memory device of claim 1 wherein the plurality of protocol signals represent protocol for LPC communication, FWH communication.

3. The memory device of claim 1 wherein the user selectable non-volatile memory comprises a non-volatile fuse.

4. The memory device of claim 3 further comprising:
    a programming logic circuit for receiving the user selected protocol to program the non-volatile fuse.

5. The memory device of claim 4 further comprising:
    said non-volatile fuse has an output;
    a fuse sense circuit for receiving the output and for generating a fuse control signal;
    a latch for receiving the fuse control circuit and for generating the select signal.

6. The memory device of claim 5 further comprising:
    a mode selecting-circuit responsive to a test signal for testing the memory device or for operating the memory device.

7. The memory device of claim 1 wherein said user selectable non-volatile memory further comprising:
    a non-volatile memory for storing the user input;
    a sensor for receiving the output of the non-volatile memory and for generating the select signal.

8. A configurable memory controller for controlling a memory, comprising:
    a decoder circuit for receiving communication signals from a communication bus, and for decoding the communication signals and for generating a protocol select signal;
    a non-volatile memory for storing user input representative of one protocol; said non-volatile memory having an output;
    a sensing circuit for receiving the output of the non-volatile memory and in response to the protocol select signal for generating a select signal;
    a multiplexer for receiving the select signal and communication signals from the communication bus and for outputting a select protocol signal in response to the select signal; wherein the select protocol signal is representative of the one protocol; and
    a controller for receiving the select signal and the select protocol signal for controlling the memory.

9. The memory controller of claim 8, wherein the plurality of protocol signals represent protocol for LPC communication, FWH communication.

10. A memory device for receiving communication signals from a communication bus, comprising;
    a decoding circuit connected to the communication bus for receiving the communication signals and for generating a protocol select signal;
    a first non-volatile memory for storing the protocol select signal;
    a delay circuit connected to the communication bus for receiving the communication signals and for generating a delayed communication signal;
    a second non-volatile memory; and
    a controller for receiving the delayed communication signal and the protocol select signal, and for controlling the operation of the second non-volatile memory in response to the delayed communication signal as selected by the protocol select signal.

* * * * *